United States Patent [19]
Odaka

[11] Patent Number: 4,473,887
[45] Date of Patent: Sep. 25, 1984

[54] PROCESSING CIRCUIT FOR OPERATING ON ELEMENTS OF A GALOIS FIELD

[75] Inventor: Kentaro Odaka, Kawasaki, Japan

[73] Assignee: Sony Corporation, Tokyo, Japan

[21] Appl. No.: 360,205

[22] Filed: Mar. 22, 1982

[30] Foreign Application Priority Data

Mar. 23, 1981 [JP] Japan .................... 56-41921

[51] Int. Cl.³ .................................. G06F 7/52
[52] U.S. Cl. .................... 364/754; 364/761
[58] Field of Search ............ 364/754, 757, 761, 764

[56] References Cited

U.S. PATENT DOCUMENTS

| | | | |
|---|---|---|---|
| 3,805,037 | 4/1974 | Ellison | 364/754 |
| 4,037,093 | 7/1977 | Gregg et al. | 364/754 |
| 4,251,875 | 2/1981 | Marrer et al. | 364/754 |

OTHER PUBLICATIONS

Brubaker et al. "Multiplication Using Logarithms Implemented With ROM" *IEEE Trans. on Computers*, vol. C-24, No. 8, Aug. 1975, pp. 761-765.
Mitchell "Computer Multiplication & Division Using Binary Logarithms" *IRE Trans. on Computers*, Aug. 1962, pp. 512-519.
Laws, Jr. et al. "A Cellular-Array Multiplier for $GE(2^m)$" *IEEE Trans. on Computers*, vol. C-20, No. 12, Dec. 1971, pp. 1573-1578.

Primary Examiner—David H. Malzahn
Attorney, Agent, or Firm—Lewis H. Eslinger; Alvin Sinderbrand

[57] ABSTRACT

An operating circuit operates on digital data words to form products or quotients of the quantities represented by the digital data words. The data words are considered as elements $\alpha^i$ of a Galois field $GF(2^m)$ where each element is a power $\alpha^i$ of an irreducible root. The data words are input into a conversion ROM which in response provides the corresponding exponents i as an output. These exponents i, j are additively combined to form a sum (i+j) or difference (i−j), and this is applied to a reverse conversion ROM. The latter then provides, as an output data word, an element $\alpha^{i+j}$ or $\alpha^{i-j}$ which is the product or quotient, respectively, of the input data words. A provision can be incorporated to compensate for division by a zero element. This circuit finds favorable application in error correction of a transmitted or recorded digital signal.

13 Claims, 5 Drawing Figures

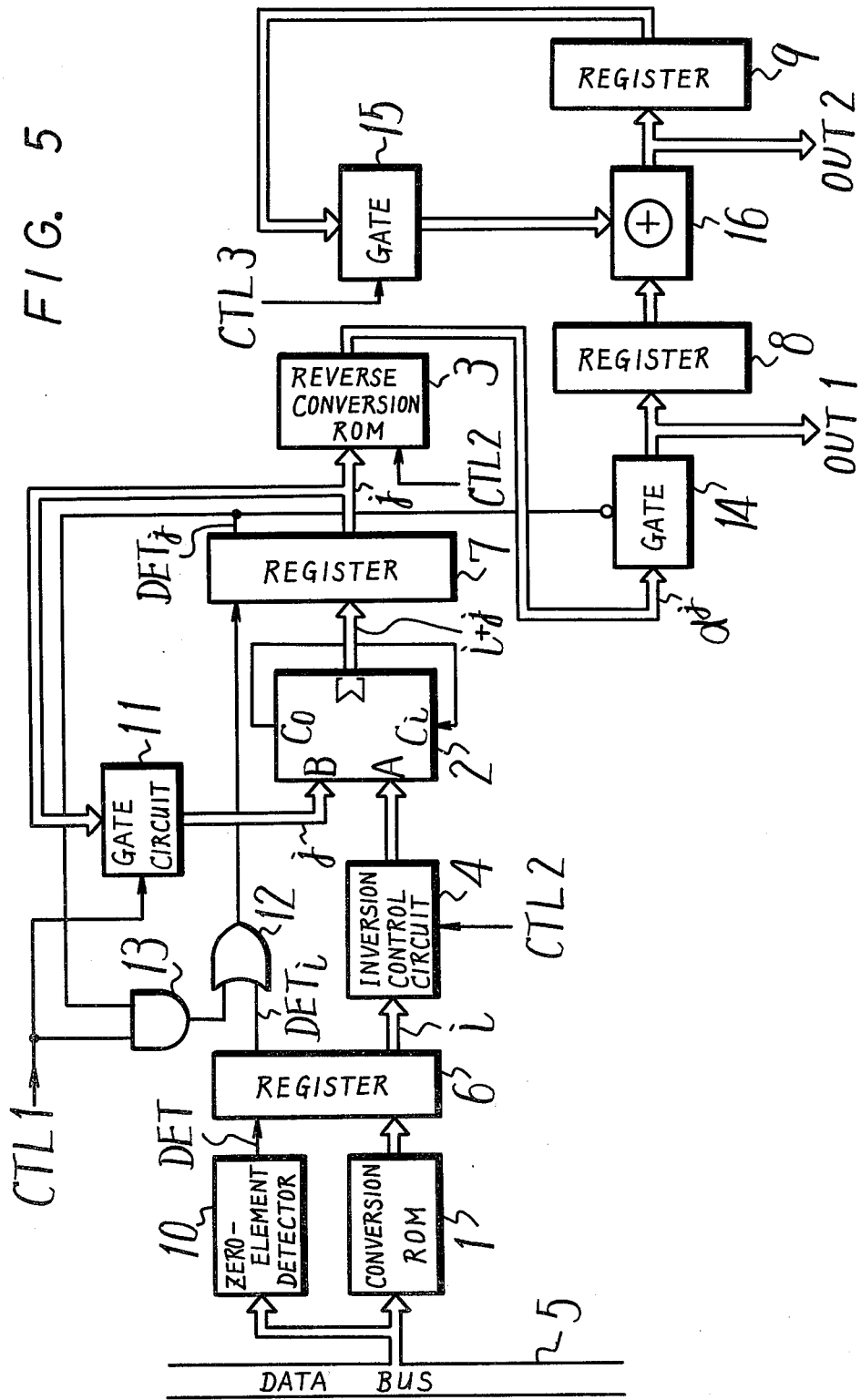

PROCESSING CIRCUIT FOR OPERATING ON ELEMENTS OF A GALOIS FIELD

BACKGROUND OF THE INVENTION

1. Field of the Invention

The present invention relates generally to a circuit for operating on digital data, and is more particularly directed to an operating circuit in which digital data words which are elements of a Galois field $GF(2^m)$ are multiplied or divided for encoding or decoding a BCH error correcting code or other similar code.

2. Description of the Prior Art

Many recently proposed systems for processing and recording a high fidelity audio signal first convert the audio signal to a digital signal, and then encode the digital signal as a pulse-code modulated (PCM) signal for recording. The recorded PCM signal can be picked up and converted to a high fidelity analog signal without appreciable loss of quality.

In order to eliminate annoying crackle or popping that can occur when errors accompany the reproduced PCM signal, data words of the digital signal to be recorded are first encoded for error correction, for example by a cross-interleaving technique, and error correction words are formed and accompany the cross-interleaved data words. Then, upon reproduction, any random errors can be corrected by means of syndromes formed by using the error-correction words, and any burst errors (for exammple, due to drop out) can be spread over many words by means of the cross-interleaving technique, and can be effectively corrected or masked.

Examples of such error correction techniques are disclosed, for example, in U.S. Pat. Appln. Ser. Nos. 230,395, filed Feb. 2, 1981, U.S. Pat. No. 4,398,292, and U.S. Pat. No. 4,413,340, all of which have a common assignee herewith.

In a typical such technique, a matrix-type error correction coding system is used, such as Bose-Chaudhuri-Hocquenghen (BCH) coding or Reed-Solomon (RS) coding. These error correction coding systems are generally in the class of q-nary convolutional coding systems whose outputs can be considered as combinations of elements of a Galois field $GF(2^m)$. Accordingly, special operating circuits are required for operating on the data words as elements of a Galois field.

Currently, such operating circuits are constructed as complex arrays of logic gates. These circuits are generally quite irregular in design and require a vast number of custom connections. Consequently, it is not practical to form an operating circuit as an integrated circuit (IC). Furthermore, even if such a circuit were integrated onto a semiconductor chip, the complexity of the circuit would require the surface area of the chip to be excessively large.

OBJECTS AND SUMMARY OF THE INVENTION

It is an object of the present invention to provide a circuit for operating on digital data words which are considered elements of a Galois field, and which can be made simple and regular in pattern so as to be easily integrable onto an IC semiconductor chip.

It is another object of this invention to provide a circuit for operating on digital data words in which a memory device, such as a ROM (read-only memory) or a PLA (programmable logic array), and an adding circuit are coupled together in recognition of the fact that a Galois field $GF(2^m)$ forms a cyclical multiplicative group of the order $2^m - 1$.

According to an aspect of this invention, there is provided an operating circuit for operating upon digital data words which form elements $\alpha^i$ and $\alpha^j$ of a Galois field $GF(2^m)$. The elements $\alpha^i$ and $\alpha^j$ are provided to inputs of converting circuits, such as ROMs, and in response the latter provide at respective outputs thereof indexes i and j (corresponding to exponents i and j where the elements $\alpha^i$ and $\alpha^j$ are powers of an irreducible root $\alpha$). The indexes i and j are combined in an adding circuit and the sum $i+j$ thereof is applied to a reverse converting circuit. The latter operates in a fashion complementary to the converting circuits and provides a product output $\alpha^{(i+j)}$ corresponding to the multiplicative product of the two input elements $\alpha^i$ and $\alpha^j$.

If an inverter is incorporated between one of the converting circuits and the adding circuit, division can be carried out to form quotients $\alpha^{(i-j)}$ formed as the quotient of one element $\alpha^i$ divided by the other element $\alpha^j$. In this case, division by zero (i.e., $\alpha^j = 0$) is prevented by identifying whether the divisor element $\alpha^j$ is zero, and, if so, changing the quotient $\alpha^{(i-j)}$ to be zero.

The above, and many other objects, features, and advantages of the present invention will become apparent from the ensuing description when considered in connection with the accompanying drawings.

BRIEF DESCRIPTION OF THE DRAWINGS

FIG. 5 is a schematic block diagram of a practical embodiment of the present invention.

DESCRIPTION OF THE PREFERRED EMBODIMENTS

Figure 1:
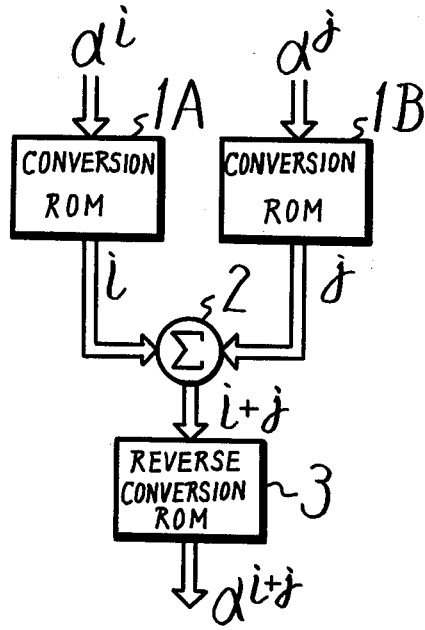
FIGS. 1, 2, 3, and 4 are schematic block diagrams of several simple embodiments of circuits according to the present invention for operating on elements of a Galois field.

For purposes of making the following detailed description more fully understood, and the significance of this invention more apparent, the nature of a Galois field will be explained briefly. The Galois field $GF(p^m)$ can be expressed either as a vector or as a cyclical group.

The vector representation will be discussed first. In this representation, the Galois field $GF(p^m)$ is considered a polynomial ring with an irreducible polynomial $F(x)$ of $m^{th}$ order of a Galois field $GF(p)$ taken as modulus. Accordingly, if a root of $F(x)$ is taken as $\alpha = [x]$ (where $[x]$ means a residue class), an element of $GF(p^m)$ can be expressed by a linear combination of $$\alpha = [x], \alpha^2 = [x^2], \ldots, \alpha^{m-1} = [x^{m-1}]$$

In other words, an element of $GF(p^m)$ can be expressed as a polynomial $$a_{m-1}[x^{m-1}] + a_{m-2}[x^{m-2}] + \cdots \\ + a_1[x] + a_0 = a_{m-1}\alpha^{m-1} + a_{m-2}\alpha^{m-2} + \cdots \\ + a_1\alpha + a_0$$

In short, this polynomial can be expressed using the vector representation $$(a_{m-1}, a_{m-2}, \ldots, a_1 a_0),$$

where $a_{m-1}, a_{m-2}, \ldots, a_1, a_0 \in GF(p)$.

The Galois field GF ($p^m$) will next be expressed by a cyclic group representation. If the zero element is excluded from the Galois field GF ($p^m$), the remaining elements form a multiplicative group G of the order $p^m - 1$. This multiplicative group is a cyclic (repeating) group. In the multiplicative group G, all elements belonging to G can be expressed as a power sequence of a certain element $\alpha$ of G. Here, if G is defined as the cyclic group, then $\alpha$ is termed as a primitive element thereof.

For example, with respect to an irreducible polynomial $F(x) = x^3 + x + 1$ on the field GF (2), a root for establishing $F(x) = 0$ is considered. The codes of the respective elements occur as in the following table, based on the relation G $$(\alpha) = \alpha^3 + \alpha + 1 = 0 \text{ (i.e., modulo} - (\alpha^3 + \alpha + 1))$$

TABLE

| Power of $\alpha$ | Linear Combination | Vector Representation |
|---|---|---|
| (undefined) | = 0 | = 000 |
| $\alpha^0$ | = 1 | = 001 |
| $\alpha^1$ | = $\alpha$ | = 010 |
| $\alpha_2$ | = $\alpha^2$ | = 100 |
| $\alpha_3$ | = $\alpha + 1$ | = 011 |
| $\alpha^4$ | = $\alpha^2 + \alpha$ | = 110 |
| $\alpha^5$ | = $\alpha^2 + \alpha + 1$ | = 111 |
| $\alpha^6$ | = $\alpha^2 + 1$ | = 101 |
| $\alpha^7$ | = 1 | = 001 |

In this case, the power of $\alpha$ is the basis of the representation as the cyclic group.

An error detecting and correcting code defined on GF ($2^m$) has been previously proposed, for example in the patent applications mentioned above. Such code has high error correction capability against both burst and random errors and, in addition, the possibility that the errors will go undetected or erroneous correction will be carried out can be reduced.

In accordance with this code, when m bits form one word and n words constitute one block of words, a set of k check words is generated based upon the following parity check matrix H.

$$H = \begin{pmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \cdot & \cdot & & \cdot & \cdot \\ \cdot & \cdot & & \cdot & \cdot \\ \alpha^{(k-1)(n-1)} & \alpha^{(k-1)(n-2)} & \ldots & \alpha^{k-1} & 1 \end{pmatrix}$$

Further, where four (k=4) check words are used, the parity check matrix H can become $$H = \begin{pmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \alpha^{3(n-1)} & \alpha^{3(n-2)} & \ldots & \alpha^3 & 1 \end{pmatrix}$$

Letting one block of the received data be represented as a column vector $\bar{V} = (\hat{W}n-1, \hat{W}n-2, \ldots, \hat{W}1, \hat{W}0)$, where $\hat{W}i = Wi + \rho i$, and $\rho i$ is an error pattern, four syndromes $S_0$, $S_1$, $S_2$, and $S_3$ are generated in a decoding stage and can be expressed as follows:

$$\begin{pmatrix} S_0 \\ S_1 \\ S_2 \\ S_3 \end{pmatrix} = H \cdot V^T$$

This error correction code can correct up to two erroneous data words within one error correction block and, if the error location is known, it can correct up to four erroneous words.

One error correction block contains four check words (p=W3, q=W2, r=W1 and s=W0). These check words are obtained as follows $$p + q + r + s = Wi = a$$

$$\alpha^3 p + \alpha^2 q + \alpha r + s = \Sigma \alpha^i Wi = b$$

$$\alpha^6 p + \alpha^4 q + \alpha^2 r + s = \Sigma \alpha^{2i} Wi = c$$

$$\alpha^9 p + \alpha^9 q + \alpha^3 r + s = \Sigma \alpha^{3i} Wi = d,$$

where $\Sigma$ implies $$\sum_{i=4}^{n-1}$$

The calculation process is omitted but only the result is shown as follows:

$$\begin{pmatrix} p \\ q \\ r \\ s \end{pmatrix} = \begin{pmatrix} \alpha^{212} & \alpha^{153} & \alpha^{152} & \alpha^{209} \\ \alpha^{156} & \alpha^2 & \alpha^{135} & \alpha^{152} \\ \alpha^{158} & \alpha^{138} & \alpha^2 & \alpha^{153} \\ \alpha^{218} & \alpha^{158} & \alpha^{156} & \alpha^{212} \end{pmatrix} \times \begin{pmatrix} a \\ b \\ c \\ d \end{pmatrix}$$

The role of the encoder provided in the transmitting or recording stage is to form four check words p, q, r, and s as described above.

An algorithm for error correction where data including the check words formed as set forth above are transmitted and received will be described next. An equation with respect to syndromes in case of two erroneous words ($\rho i$ and $\rho j$) is $$\begin{cases} S_0 = \rho i + \rho j \\ S_1 = \alpha^i \rho i + \alpha^j \rho j \\ S_2 = \alpha^{2i} \rho i + \alpha^{2j} \rho j \\ S_3 = \alpha^{3i} \rho i + \alpha^{3j} \rho j \end{cases}$$

Transforming this equation, we obtain:

$$(\alpha^i S_0 + S_1)(\alpha^i S_2 + S_3) = (\alpha^i S_1 + S_2)^2$$

Further transforming this, the following error location polynomial is obtained:

$$(S_0 S_2 + S_1^2) \alpha^{2i} + (S_1 S_2 + S_0 S_3) \alpha^i + (S_1 S_3 + S_2^2) = 0,$$

where coefficients of the respective equations are given as $$\begin{cases} S_0S_2 + S_1^2 = A \\ S_1S_2 + S_0S_3 = B \\ S_1S_3 + S_2^2 = C \end{cases}$$

By using the respective coefficients A, B, and C of the above equations, it is possible to determine the error locations for up to two erroneous words.

[1] For no error:

$A = B = C = 0$, $S_0 = 0$ and $S_3 = 0$

[2] For one word in error:

When $A = B = C = 0$, $S_0 \neq 0$, and $S_3 \neq 0$, one word is considered to be in error. The error location i can be determined from the relation $\alpha^i = S_1/S_0$, and the error is corrected by using the relation $pi = S_0$.

[3] For two words in error:

$A \neq 0$, $B \neq 0$, and $C \neq 0$ are established, and the discrimination or judgment of the error is thereby facilitated greatly. At this time, it is also established that $A\alpha^{2i} + B\alpha^i + C = 0$ (where i=0 to (n−1))

In this case, if the relations $B/A = D$ and $C/A = E$ are considered, $D = \alpha^i + \alpha^j$, $E = \alpha^i \cdot \alpha^j$ and $\alpha^{2i} + D\alpha^i + E = 0$.

Assuming that t represents the number of data words between two error locations, that is, (j=i+t), the above equation is modified to $D = \alpha^i(1 + \alpha^t)$, $E = \alpha^{2i+t}$ thus $D^2/E = (1+\alpha^t)^2/\alpha^t = \alpha^{-t} + \alpha^t$ Accordingly, if the values of $\alpha^{-t}$ and $\alpha^t$, for all values of t=1 to (n−1), are stored in respective memory locations of a ROM (Read-Only-Memory), the coincidence between $(\alpha^{-t} + \alpha^t)$ can be obtained from the output of the ROM.

Then, if the value $(D^2)/E$ calculated from the received or decoded data word is detected, t can be obtained. If this coincidence relation is not established, it is regarded that more than three words are in error. To carry out the above, the following equations are given $X = 1 + \alpha^t$ $Y = 1 + \alpha^{-t} = (D^2)/E + X$.

Thus, $\alpha^i$ and $\alpha^j$ can be expressed $\alpha^i = D/X$, and $\alpha^j = D/Y$, and, therefore, the error locations i and j can be easily obtained. Error patterns $pi$ and $pj$ are obtained as $$pi = \frac{(\alpha^j S_0 + S_1)}{D} = \frac{S_0}{Y} + \frac{S_1}{D}$$

-continued $$pj = \frac{(\alpha^i S_0 + S_1)}{D} = \frac{S_0}{X} + \frac{S_1}{D}$$

Accordingly, with the error locations known, error corrections can be performed.

With the aforesaid error detecting and correcting code, it is considered that each word is formed as an eight-bit byte. Thus, when sixteen-bit data words are used, for example, in digital audio work, these sixteen-bit words are broken up into an upper eight-bit byte and a lower eight-bit byte. Then, a Galois field GF ($2^8$) based on eight bits is used, and the irreducible polynomial root thereof is represented as $F(x) = x^8 + x^4 + x^3 + x^2 + 1$. The elements form a cyclic group of order 255.

In the encoding and decoding as set forth above, it is necessary to calculate the elements $\alpha^i$ and $\alpha^j$, as well as products and quotients thereof. The present invention can be applied for the multiplication and division in such calculation.

Examples of the circuit according to the present invention for operating on these elements of a Galois field will hereinafter be described with reference to the attached drawings. In the circuit of each of FIG. 1 to FIG. 4, a conversion ROM 1A generates an index i when an element $\alpha^i$ is supplied thereto and conversion ROM 1B generates an index j when it is supplied with an element $\alpha^j$. The indexes i and j are binary codes of m bits, respectively.

A modulo-($2^m - 1$) adder 2 has inputs coupled to receive the indexes i and j and an output connected to a reverse conversion ROM 3. The latter produces a data output which is the product of the elements $\alpha^i$ and $\alpha^j$, or, generally, is a power of the irreducible root or primitive element, $\alpha$. The exponent of the data output is the sum (or difference) of the input indexes i and j.

In the above arrangement, PLAs or other equivalent devices can be used in place of the ROMs 1A, 1B, and 3.

FIG. 1 shows an embodiment of this invention in which the indexes (or exponents) i and j are generated respectively in the conversion ROMs 1A and 1B, and are supplied to the adder 2. The latter adds these indexes together so as to produce a sum output i+j, which is provided to the reverse conversion ROM 3. The latter provides a product output $\alpha^{i+j} = \alpha^i \cdot \alpha^j$ as its data output.

Figure 2:
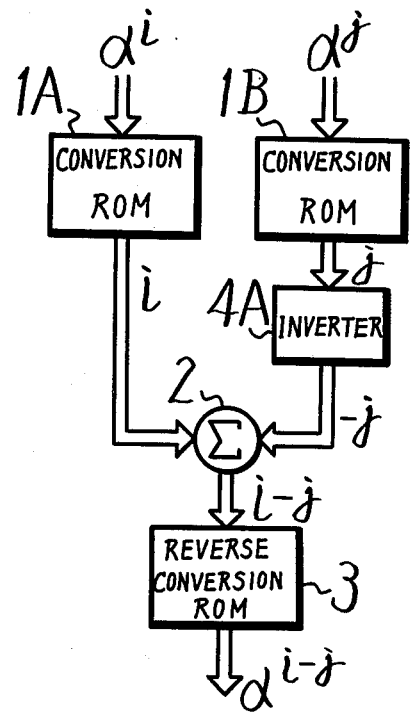

FIG. 2 shows another embodiment of this invention in which the index j generated from the conversion ROM 1B is supplied to and inverted by an inverter 4A, and furnished thence to the adder 2. A difference output i−j is supplied from the adder 2 to the reverse conversion ROM 3; thus a quotient output ($\alpha^{i-j} = \alpha^i/\alpha^j$) is provided as the data output.

Figure 3:
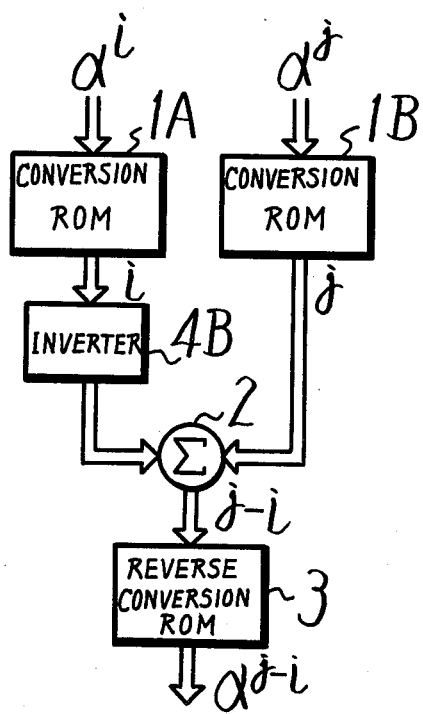

FIG. 3 shows a further embodiment of the invention in which the index i produced from the conversion ROM 1A is supplied to and inverted by an inverter 4B and supplied from the latter to the adder 2. A difference output j−i therefrom is supplied to the reverse conversion ROM 3, and the latter provides a quotient output ($\alpha^{j-i} = \alpha^j/\alpha^i$) as its data output.

Figure 4:
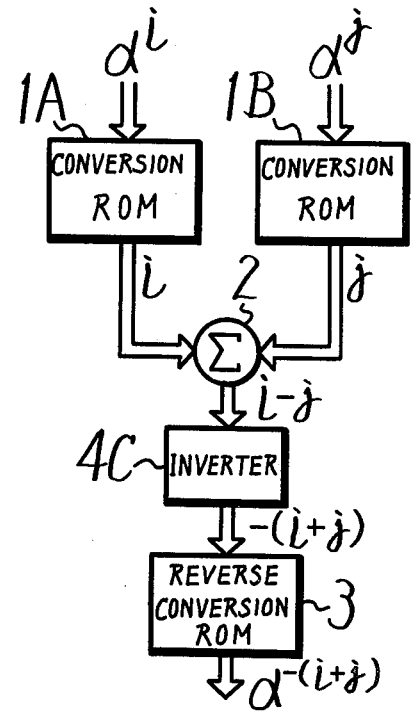

FIG. 4 shows a still further embodiment of the invention in which the outputs from the conversion ROMs 1A and 1B are supplied to the adder 2 so that a sum output i+j therefrom is furnished to and inverted by an inverter 4C. The inverted sum output (i+j) is then delivered to the reverse conversion ROM 3 thereby producing an inverted output $\alpha^{-(i+j)} = 1/(\alpha i + j)$ as its data output.

Further, a single circuit arrangement including all three inverters 4A, 4B, 4C adapted to perform either an inverting or a non-inverting operation, in accordance with an external control signal, can be constructed thus enabling multiplication or division to be switched in response to such control signal.

In the case of one word error, where the error detecting and correcting code is decoded as described previously, it is necessary that $\alpha^i = S_1/S_0$ be calculated so that the error location can be determined from $\alpha^i$. However, if the dividing circuit (FIG. 2 or FIG. 3) according to the present invention is used, the error location i can be obtained from the adder 2 directly.

Now, with reference to FIG. 5, one practical embodiment of the present invention will further be described.

According to this embodiment, an inversion control circuit or controller 4 is provided to switchably change over its inverting operation and the non-inverting operation in accordance with a control signal $CTL_2$. For example, the inversion control circuit 4 is adapted for inversion and non-inversion if the control signal $CTL_2$ is "1" and "0", respectively. This circuit 4 enables either multiplication or division to be carried out and also permits a time-sharing process to be adopted to reduce the number of the required conversion ROMs to one.

In FIG. 5, a data bus 5 supplies data words to a single conversion ROM 1. The latter converts each incoming data word, as an element $\alpha^i$ to the associated index i, and the latter is stored in a data register 6.

Incoming data words are also supplied from the data bus 5 to a zero element detector 10. The zero element detector 10 produces a single-bit detecting signal DET of "1" when the input data word is the zero element and of "0" when the input data word is not the zero element. This detecting signal DET is stored in the register 6 together with the index data (for example, eight bits) derived from the conversion ROM 1. The data stored in the register 6 are supplied through the inversion controller 4 to a modulo-$(2^m - 1)$ adder 2 as an input A thereto. Here, m=8 and the adder 2 is a modulo-255 adder. As another input B of the adder 2, data, stored in a subsequent register 7 located at the next stage and passed through a gate circuit 11, are used.

The gate circuit 11 is controlled by a control signal $CTL_1$. When the control signal $CTL_1$ is "1", the gate circuit 11 passes the data derived from the register 7 therethrough and supplies it to the adder 2 as the input B, thus resulting in a sum output A+B. When the control signal $CTL_1$ is "0", the gate circuit 11 blocks data from passing therethrough and instead makes its output data zero so that the output is simply A. In other words, the input data, as-is, are delivered from the adder 2 to the register 7.

Also, the detecting signal $DET_i$ associated with the data word element $\alpha^i$ is suplied from the register 6 through an OR gate 12 to the register 7. The detecting signal $DET_j$ previously stored in the register 7 and associated with a previous data word element $\alpha^j$ is applied through an AND gate 13 to the OR gate 12. The control signal $CTL_1$ is used as another input of this AND gate 13, so that when $CTL_1$ is "1", the output from the OR gate 12 is "1" even in the case where the detecting signal $DET_i$ stored in the register 7 is "0".

The modulo-255 adder 2 can be comprised of an eight-bit full adder in which its carry output $C_0$ is positively fed back to its own carry input $C_i$. Depending on the value of the added output, the adder 2 operates as follows, where $\Sigma$ is the contents of the adder 2:

| | |
|---|---|
| $0 \leq A + B \leq 254$ | $\Sigma = A + B \; C_0 = 0$ |
| $A + B = 255$ | $\Sigma = 255 \; C_0 = 0$ |
| $A + B = 256$ | after $\Sigma = 0$ and $C_0 = 1$, |
| | $\Sigma = 1$ and $C_0 = 1$ |
| $256 < A + B \leq 510$ | $\Sigma = A + B - 255$ and $C_0 = 1$ |

Then, the added output data stored in the register 7 is supplied to the reverse conversion ROM 3 which produces the data element $\alpha^{i+j}$ in which this added output $\Sigma$ is taken as the index, or exponent. The reverse conversion ROM 3 is supplied with the control signal $CTL_2$, which is also applied to the inversion controller 4 to switch the multiplication and the division functions alternately. The data output from the reverse conversion ROM 3 is presented as an output OUT 1 by way of a gate circuit 14, and is also supplied to an element storage register 8. When the detecting signal DET stored in the register 7 is "1", the gate circuit 14 causes the data output of the gate circuit 14 to be zero.

In this embodiment, modulo-2 added outputs of two data elements $\alpha^i$ and $\alpha^j$ are further produced as an output OUT 2, and this is stored in another element storage register 9. The output data stored in the register 9 are passed through a gate circuit 15 and are supplied to a modulo-2 adder 16 together with the output data from the register 8, so as to produce the data output OUT 2. The gate circuit 15 is controlled by a control signal $CTL_3$ to pass the data stored in the register 9 therethrough and supplies it to the adder 16 only when required to obtain the modulo-2 output OUT 2.

In the above practical embodiment of the present invention as set forth above, when the multiplication operation is performed, the control signal $CTL_2$, which can be supplied from a microprocessor (not shown) to the inversion controlled 4, becomes "0" to control the same to perform the non-inversion operation.

More specifically, at first, the eight-bit data element $\alpha^j$ is supplied through the data bus 5. Next, the eight-bit element data $\alpha^i$ passes therethrough in the same manner. Accordingly, the data element $\alpha^i$ is supplied to the conversion ROM 1 and the index data i and the associated detecting signal $DET_i$ are stored in the register 6. At such time, the register 7 stores the index data j and the detecting signal $DET_j$ of the data element $\alpha^j$.

Thereafter, when the control signal $CTL_1$ becomes "1", the sum (i+j) of the index data i and j is formed by the adder 2. Further, in the next step, this sum (i+j) and the output from the OR gate 12 are fed to and stored in the register 7. The reverse conversion ROM 3 produces an output $\alpha^{i+j}$ based on the sum output (i+j). When neither of two output data elements $\alpha^i$ and a $\alpha^j$ is the zero element, the output data $\alpha^{i+j}$ of the reverse conversion ROM 3 appear as the output OUT 1. On the other hand, when either one of the data elements $\alpha^i$ and $\alpha^j$ is the zero element, the reverse conversion ROM produces either the output data element $\alpha^i$ or $\alpha^j$. However, the output data element so produced is converted to the zero element in response to the detecting signal supplied to the gate circuit 14.

When a division operation is to be performed, the control signal $CTL_2$ becomes "1", and the index data generated from the conversion ROM 1 are passed through the inversion controlled 4 so as to invert such data. In other words, the quotient $\alpha^j/\alpha^i$ means that an inverse element $\alpha^{-i}$ is multiplied by $\alpha^j$ and this inverse element $\alpha^{-i}$ satisfies the relation $\alpha^i \cdot \alpha^{-i} = \alpha^0 = 1$. The inverse index $-i$ is a complement for the index i with respect to unity. In this embodiment, the bits of the index are inverted between "0" and "1", i.e., to the complementary bits "1" and "0". Therefore, the other processes aside from the above are the same as those of the multiplication operations as described before. Of course, in the inversion controller 4, if j is inverted to $-j$, the divided output, or quotient of $\alpha^i/\alpha^j$ can be calculated.

In a division operation, the result of any operation involving the zero element has no real significance. In other words, quotients $\alpha^i/0$ and $0/0$ can not be defined. In this embodiment, it is detected whether the zero element is received from the data bus 5, and if the zero element is so detected, the calculated output is forcibly converted to the zero element by the gate circuit 14. The divided output is never the zero element, so that if the zero element appears in the output, it is considered as abnormal. Accordingly, the other circuit to which the divided output is supplied performs a predetermined operation confirming that the divided output is not the zero element.

As it will be understood from the description of the one practical embodiment of the invention as set forth above, unlike the prior art circuit for operating on digital data as element of a Galois field, in which circuit many gate circuits are combined, the operating circuit of this invention can be simply constructed by the ROMs, the adders, and the registers as shown, thus achieving a relatively simple circuit suitable for integration onto a semiconductor chip.

Also, in the aforesaid FIG. 5 embodiment of this invention, because a time-sharing process is used, only one conversion ROM 1 and only a single reverse conversion ROM 3 are required, thereby further simplifying the arrangement of the circuit of this invention.

While particular embodiments have been described hereinabove, it should be understood that many modifications and variations thereof will suggest themselves to those of ordinary skill without departure from the scope or spirit of this invention, as defined in the following claims.

What is claimed is:

1. An operating circuit for operating on m bit digital data word signals which represent elements $\alpha^i$ of a Galois field GF ($2^m$) having an irreducible root $\alpha$, m being a whole number, each of said elements corresponding to a power $\alpha^i$ of the irreducible root $\alpha$ of said Galois field GF ($2^m$), comprising:
    input bus means providing said digital data word signals as input element signals;
    converting circuit means to which said input element signals are applied and generating in response corresponding exponent signals for said elements $\alpha^i$ of said Galois field GF ($2^m$);
    additive combining means including a modulo-($2m-1$) adder for combining the corresponding exponent signals of a plurality of said input element signals to form a sum signal of m bits representing the resulting sum thereof; and
    reverse converting circuit means to which said sum signal is applied for generating in response thereto an output data element signal of m bits that corresponds to said irreducible element $\alpha$ taken to the power of said resulting sum.

2. An operating circuit according to claim 1; wherein said converting circuit means includes a randomly accessible memory device to which said input element signals are input as address code signals and which provides said exponent signals as stored data signals.

3. An operating circuit according to claim 2; wherein said memory device is a read-only memory.

4. An operating circuit according to claim 1; wherein said reverse converting circuit means includes a randomly accessible memory device to which said sum signal is input as an address code signal and which provides said element signals representing said elements $\alpha^i$ as stored data signals.

5. An operating circuit circuit according to claim 4; wherein said memory device is a read-only memory.

6. An operating circuit according to claim 1; wherein said combining means includes an inverter connected between said converting circuit means and said adder so that said sum signal represents a difference between exponents of corresponding input digital data word signals, and said reverse converting circuit means provides said output data element signal representing the quotient of said input digital data word signals.

7. An operating circuit according to claim 6; wherein said inverter operates by forming a signal representing a complement of the digital signal applied thereto.

8. An operating circuit according to claim 1; wherein said combining means includes an inverter disposed between said adder and said reverse converting circuit means so that the latter provides an output which is the inverse of the product of said input words.

9. An operating circuit according to claim 1; further comprising means providing a detecting signal if one of said input digital data word signals corresponds to a zero element of said Galois field GF ($2^m$), and means for setting said output data element signal to a predetermined value in response to said detecting signal, such that any quotient resulting from division by zero is compensated.

10. An operating circuit for operating on digital data words of a predetermined bit length m such that the digital data words constitute elements $\alpha^i$ of a Galois field ($2^m$) having an irreducible root $\alpha$, each element corresponding to a power $\alpha^i$ of the irreducible root $\alpha$, comprising an input data bus providing said digital data words in time sequence, a conversion device to which said digital data words are applied in sequence as said elements and in response thereto providing corresponding exponents i thereof; a first register coupled to said conversion circuit for storing said exponents i; a controlled inversion circuit following said first register and controlled by an inversion control signal so that said controlled inversion circuit provides, as an output thereof, said exponents i without inversion when said inversion control signal has one sense and with inversion when said inversion control signal has another, complementary sense; a modulo-($2^m-1$) adder having first and second inputs and an output, with the output of said controlled inversion circuit being coupled to said first input thereof; a second register having an input coupled to the output of said adder for storing the contents thereof and having an output; a controlled gate circuit having an input coupled to the output of said second register and an output coupled to the second input of said modulo-($2^m-1$) adder and controlled by a gate control signal selectively to pass the contents of said second register to said adder; and a reverse conversion device coupled to the output of said second register to receive the contents thereof, and in response thereto to provide an output data word that is the power of said irreducible element corresponding to the contents of the second register.

11. An operating circuit according to claim 10; further comprising a zero element detector coupled to said data bus and providing to said first register a detecting signal of one sense to indicate that an associated one of the input data words is zero but of another, complementary sense otherwise; logic gate means providing the detecting signal stored in said first register to said second register; and output gate means having a control input controlled by the detecting signal stored in said second register and a data input following said reverse conversion device for passing the output of the latter when said detecting signal stored in said second register has said other sense and blocking said output when said detecting signal has said one sense.

12. An operating circuit according to claim 11; wherein said logic gate means includes an AND gate having inputs to receive the detecting signal stored in said second register and said gate control signal, respectively, and an output; and an OR gate having inputs coupled to the output of said AND gate and to said first register to receive the detecting signal stored therein, respectively, and an output coupled to said second register.

13. An operating circuit according to claim 10; wherein said bit length m is eight bits and said adder is a Modulo-255 adder.

* * * * *